(12) United States Patent
Klinger et al.

(10) Patent No.: US 6,878,591 B2
(45) Date of Patent: Apr. 12, 2005

(54) SELF ALIGNED METHOD OF FORMING NON-VOLATILE MEMORY CELLS WITH FLAT WORD LINE

(75) Inventors: Pavel Klinger, San Jose, CA (US); Sreeni Maheshwarla, Sunnyvale, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 190 days.

(21) Appl. No.: 10/310,441

(22) Filed: Dec. 4, 2002

(65) Prior Publication Data

US 2003/0153152 A1 Aug. 14, 2003

Related U.S. Application Data

(60) Provisional application No. 60/355,284, filed on Feb. 7, 2002, and provisional application No. 60/355,027, filed on Feb. 7, 2002.

(51) Int. Cl.[7] .......................................... H01L 21/8247
(52) U.S. Cl. ..................................................... 438/267
(58) Field of Search ................................ 438/257–267

(56) References Cited

U.S. PATENT DOCUMENTS

| | | | |
|---|---|---|---|
| 4,757,360 A | 7/1988 | Farone | |
| 4,794,565 A | 12/1988 | Wu et al. | |
| 4,882,707 A | 11/1989 | Mizutani | |
| 4,931,847 A | 6/1990 | Corda | |
| 4,947,221 A | 8/1990 | Stewart et al. | |
| 5,021,848 A | 6/1991 | Chiu | |
| 5,029,130 A | 7/1991 | Yeh | |
| 5,041,886 A | 8/1991 | Lee | |
| 5,101,250 A | 3/1992 | Arima et al. | |
| 5,268,319 A | 12/1993 | Harari | |
| 5,429,965 A | 7/1995 | Shimoji | |
| 5,493,138 A | 2/1996 | Koh | |
| 5,544,103 A | 8/1996 | Lambertson | |
| 5,572,054 A | 11/1996 | Wang et al. | |
| 5,751,048 A | 5/1998 | Lee et al. | |
| 5,780,341 A | 7/1998 | Ogura | |
| 5,780,892 A | 7/1998 | Chen | |
| 5,789,293 A | 8/1998 | Cho et al. | |
| 5,796,139 A | 8/1998 | Fukase | |
| 5,808,328 A | 9/1998 | Nishizawa | |
| 5,811,853 A | 9/1998 | Wang | |
| 5,814,853 A | 9/1998 | Chen | |
| 6,091,104 A | 7/2000 | Chen | |
| 6,103,573 A | 8/2000 | Harari et al. | |
| 6,140,182 A | 10/2000 | Chen | |
| 6,222,227 B1 | 4/2001 | Chen | |
| 6,429,075 B1 | 8/2002 | Yeh et al. | |
| 6,569,736 B1 * | 5/2003 | Hsu et al. | 438/267 |
| 6,593,187 B1 * | 7/2003 | Hsieh | 438/257 |
| 6,642,103 B1 * | 11/2003 | Wils et al. | 438/257 |

FOREIGN PATENT DOCUMENTS

EP 0 389 721 A2 10/1990

OTHER PUBLICATIONS

U.S. Appl. No. 09/401,622, filed Sep. 22, 1999, Johnson.

* cited by examiner

*Primary Examiner*—Richard A. Booth
(74) *Attorney, Agent, or Firm*—DLA Piper Rudnick Gray Cary US LLP

(57) ABSTRACT

A method of forming an electrically erasable non-volatile memory cell array. Each memory cell includes a floating gate, a block of insulation material over the floating gate, and a control gate disposed laterally adjacent to and over the floating gate. The insulation material block is formed with a planarized upper surface (using a dummy poly layer as a planarization etch stop). The control gate is formed with a planarized upper surface (using the insulation material block upper surface as a planarization etch stop).

17 Claims, 5 Drawing Sheets

SELF ALIGNED METHOD OF FORMING NON-VOLATILE MEMORY CELLS WITH FLAT WORD LINE

This application claims the benefit of U.S. Provisional Application No. 60/355,284, filed Feb. 7, 2002, and entitled Process Scheme for Source Planarization; and of U.S. Provisional Application No. 60/355,027, filed Feb. 7, 2002, and entitled New Process Scheme for Flat WL; the disclosures of which are incorporated herein by reference in their entirety.

FIELD OF THE INVENTION

The present invention relates to a self-aligned method of forming a semiconductor memory array of floating gate memory cells of the split gate type.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type, or a combination thereof.

One type of such split gate type memory cell has separated first (source) and second (drain) regions formed in a semiconductor substrate with a channel region therebetween. A floating gate is insulated from the substrate and is disposed over a first portion of the channel. A control gate is insulated from the substrate and is spaced apart from the floating gate and is disposed over a second portion of the channel, different from the first portion. Such a cell is exemplified by U.S. Pat. No. 5,029,130. Methods for making such a type cell is also disclosed in the aforementioned patent.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, self alignment minimizes the number of masking steps necessary to form memory cell structures, and enhances the ability to scale such structures down to smaller dimensions.

U.S. Pat. No. 6,429,075 discloses a method of self-aligning the floating gate to the control gate by forming the floating gate underneath insulation material, forming insulation material around exposed ends of the floating gate, and forming the control gate as a spacer of conductive material that is disposed laterally adjacent to and over the floating gate.

The formation of spacers is well known in the art, and includes depositing a material over the contour of a structure, followed by an anisotropic etch process, whereby the deposited material is removed from horizontal surfaces of the structure, while the material remains largely intact on vertically oriented surfaces of the structure. Ideally, spacers are formed with rounded upper surfaces. In reality, spacer upper surfaces can include pits or trenches that collect processing materials during subsequent processing steps, and can result in the formation of "stringers" or other deformations of the spacer structure. Deformed spacers can render the resulting memory cell inoperative (e.g. punch through problems because ion implantation used to form source/drain penetrates through the control gate).

To prevent the formation of spacer surface pits or trenches, the anisotropic etch is prolonged during spacer formation, which is known as "over-etch". The problem with over-etch is that more of the spacer material is removed than is desired, and the resulting spacer structure can be too small. As the design rules are decreased to reduce the overall size of the memory cells, there is little if any margin to allow for spacer over-etch and still provide a functional memory cell structure.

SUMMARY OF THE INVENTION

The present invention solves the aforementioned problems by providing a method of making an electrically erasable programmable memory cell that prevents spacer stringers or the need for an over-etch process. The method includes the steps of forming a first layer of polysilicon disposed over and insulated from a semiconductor substrate of a first conductivity type, forming a block of insulation material over the first polysilicon layer which leaves portions of the first polysilicon layer exposed, removing the exposed portions of the first polysilicon layer to form a floating gate underneath the block of insulation material, forming a block of polysilicon that is disposed over and insulated from the substrate and is disposed adjacent to and insulated from the floating gate, wherein the formation of the polysilicon block includes a planarization etch for planarizing an upper surface of the polysilicon block using an upper surface of the insulation material block as a planarization etch stop, and forming spaced apart first and second regions in the substrate that have a second conductivity type, with a channel region defined in the substrate between the first and second regions.

In another aspect of the present invention, the method includes the steps of forming a first layer of polysilicon disposed over and insulated from a semiconductor substrate of a first conductivity type, forming blocks of insulation material over the first polysilicon layer, removing portions of the first polysilicon layer not disposed underneath the blocks of insulation material to form a plurality of spaced apart floating gates, forming blocks of polysilicon each disposed over and insulated from the substrate and each disposed adjacent to and insulated from one of the floating gates, wherein the formation of the polysilicon blocks includes a planarization etch for planarizing upper surfaces of the polysilicon blocks using upper surfaces of the insulation material blocks as a planarization etch stop, and forming spaced apart first and second regions in the substrate that have a second conductivity type, with channel regions each defined in the substrate between one of the first regions and one of the second regions.

Other objects and features of the present invention will become apparent by a review of the specification, claims and appended figures.

DETAILED DESCRIPTION OF THE PREFERRED EMBODIMENTS

The present invention is method of forming split-gate, non-volatile, memory cells without forming stringers or other defects in the upper surface of the control gates.

Isolation Region Formation

Figure 1A:
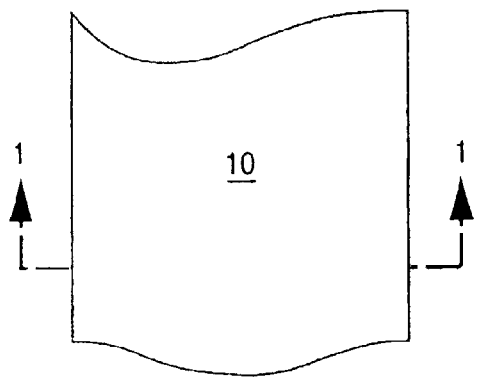
FIG. 1A is a top view of a semiconductor substrate used in the first step of the method of present invention to form isolation regions.
Figure 1B:
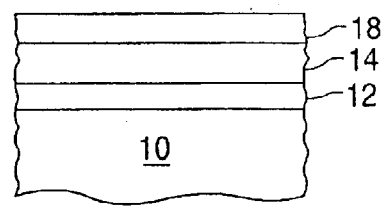
FIG. 1B is a cross sectional view taken along the line 1—1.

Referring to FIG. 1A there is shown a top plan view of a semiconductor substrate 10 (or a semiconductor well), which is preferably of P type and is well known in the art. A first layer of insulation material 12, such as silicon dioxide (oxide), is formed (e.g. deposited, grown, etc.) thereon as shown in FIG. 1B. The first insulation layer 12 is preferably formed on the substrate 10 by well known techniques such as oxidation or deposition (e.g. chemical vapor deposition or CVD), forming a layer of oxide preferably 80 Å thick. A first layer of polysilicon 14 (hereinafter "poly") is formed on the first layer of insulation material 12 (e.g. 700 to 800 Å thick). The formation of the first polysilicon layer 14 on the first insulation layer 12 can be made by a well known process such as Low Pressure CVD or LPCVD. A silicon nitride layer 18 (hereinafter "nitride") is deposited over the polysilicon layer 14, preferably by CVD (e.g. 1000 Å thick). This nitride layer 18 is used to define the active regions during isolation formation. Of course, all of the forgoing described parameters and the parameters described hereinafter, depend upon the design rules and the process technology generation. What is described herein is for the 0.18 micron process. However, it will be understood by those skilled in the art that the present invention is not limited to any specific process technology generation, nor to any specific value in any of the process parameters described hereinafter.

Figure 1C:
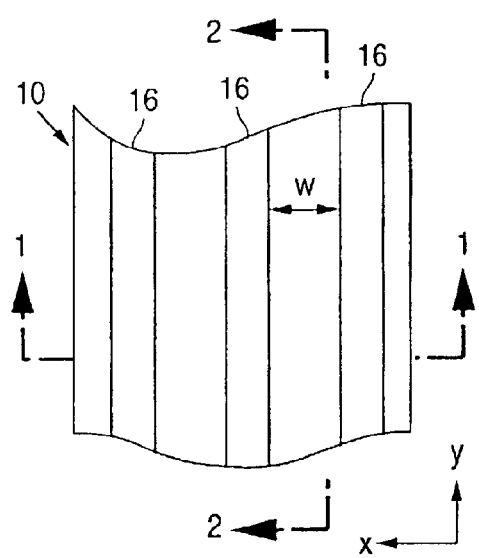
FIG. 1C is a top view of the next step in the processing of the structure of FIG. 1B, in which isolation regions are formed.
Figure 1D:
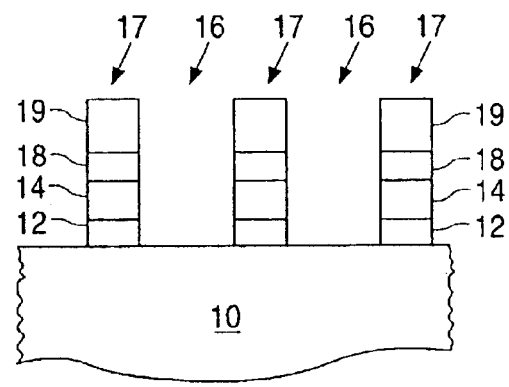
FIG. 1D is a cross sectional view of the structure in FIG. 1C taken along the line 1—1 showing the isolation stripes formed in the structure.

Once the first insulation layer 12, the first polysilicon layer 14, and the silicon nitride 18 have been formed, suitable photo-resistant material 19 is applied on the silicon nitride layer 18 and a masking step is performed to selectively remove the photo-resistant material from certain regions (stripes 16) of the substrate. Where the photo-resist material 19 is removed, the silicon nitride 18, the polysilicon 14 and the underlying insulation material 12 are etched away in stripes 16 formed in the Y or column direction, as shown in FIG. 1C, using standard etching techniques (i.e. anisotropic etch processes). The distance W between adjacent stripes 16 can be as small as the smallest lithographic feature of the process used. Where the photo resist 19 is not removed, the silicon nitride 18, the first polysilicon region 14 and the underlying insulation region 12 are maintained. The resulting structure is illustrated in FIG. 1D, with active regions 17 interlaced with isolation regions 16. As will be described, there are two embodiments in the formation of the isolation regions: LOCOS and shallow trench insulation (STI). In the STI embodiment, the etching continues into the substrate 10 to a predetermined depth.

The structure is further processed to remove the remaining photo resist 19. Then, an isolation material 20a or 20b, such as silicon dioxide, is formed in the isolation regions 16. The nitride layer 18 is then selectively removed to form the structure shown in FIG. 1E. The isolation can be formed via the well known LOCOS process resulting in the local field oxide 20a (e.g. by oxidizing the exposed substrate), or it can be formed via the shallow trench process (STI) resulting in a block of silicon-dioxide 20b being formed in the isolation regions 16 (e.g. by depositing an oxide layer, followed by a Chemical-Mechanical-Polishing or CMP etch). It should be noted that during the LOCOS formation, a spacer may be necessary to protect the side walls of poly layer 14 during the formation of the local field oxide.

Figure 1E:
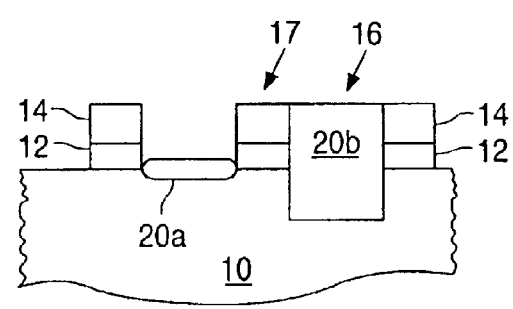
FIG. 1E is a cross sectional view of the structure in FIG. 1C taken along the line 1—1 showing the two types of isolation regions that can be formed in the semiconductor substrate: LOCOS or shallow trench.

The remaining first polysilicon layer 14 and the underlying first insulation material 12 form the active regions 17. Thus, at this point, the substrate 10 has alternating stripes of active regions and isolation regions with the isolation regions being formed of either LOCOS insulation material 20a or shallow trench insulation material 20b. Although FIG. 1E shows the formation of both a LOCOS region 20a and a shallow trench region 20b, only one of the LOCOS process (20a) or the shallow trench process (20b) will be used. In the preferred embodiment, the shallow trench 20b will be formed. STI is preferable because it can be more precisely performed at smaller design rules.

The structure in FIG. 1E represents a self aligned structure, which is more compact than a structure formed by a non self-aligned method. A non self-aligned method of forming the structure shown in FIG. 1E, which is well known and is conventional, is as follows. Regions of isolation are first formed in the substrate 10. This can be done by depositing a layer of silicon nitride on the substrate 10, depositing photo-resist, patterning the silicon nitride using a first masking step to expose selective portions of the substrate 10, and then oxidizing the exposed substrate 10 using either the LOCOS process or the STI process where silicon trench formation and trench fill are involved. Thereafter, the silicon nitride is removed, and a first layer of silicon dioxide 12 (to form the gate oxide) is deposited over the substrate 10. A first layer of polysilicon 14 is deposited over the gate oxide 12. The first layer of polysilicon 14 is then patterned using a second masking step and selective portions removed. Thus, the polysilicon 14 is not self aligned with the regions of isolation, and a second masking step is required. Further, the additional masking step requires that the dimensions of the polysilicon 14 have an alignment tolerance with respect to the regions of isolation 16. It should be noted that the non self-aligned method does not utilize nitride layer 18.

Memory Array Formation

Figure 2A:
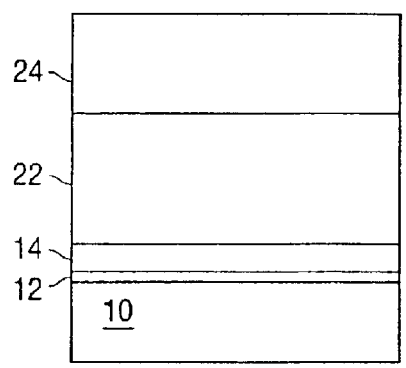
FIGS. 2A–2N are cross sectional views taken along the line 2—2 of FIG. 1C showing in sequence the next step(s) in the processing of the structure shown in FIG. 1E, in the formation of a non volatile memory array of floating memory cells of the split gate type.
Figure 2B:
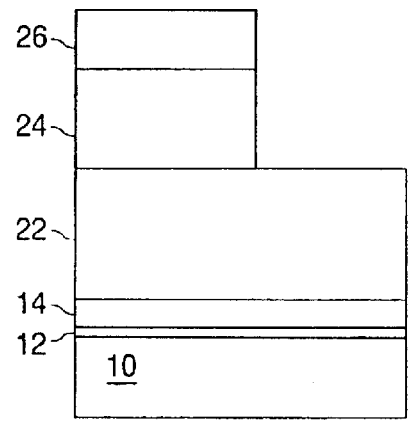
Figure 2C:
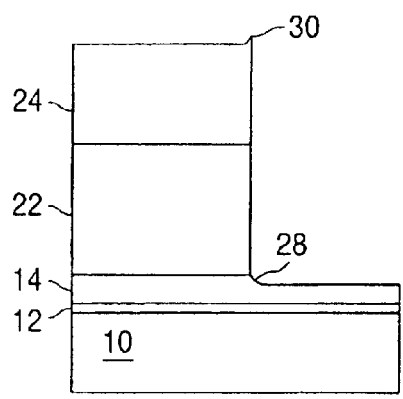
Figure 2D:
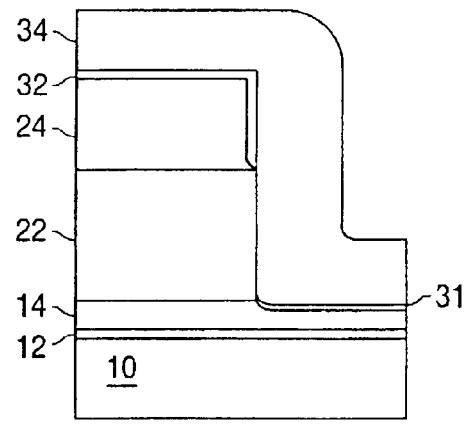
Figure 2E:
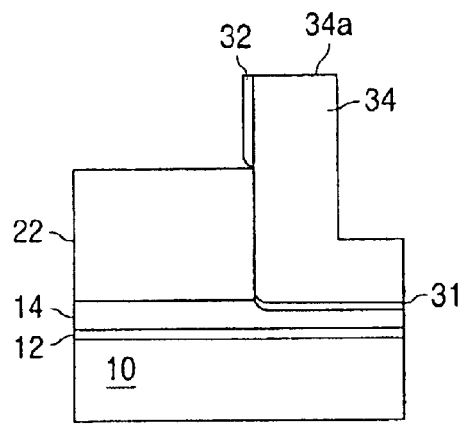
Figure 2F:
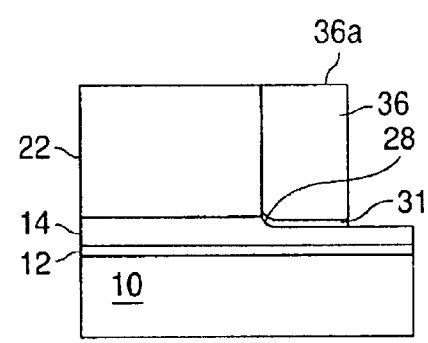
Figure 2G:
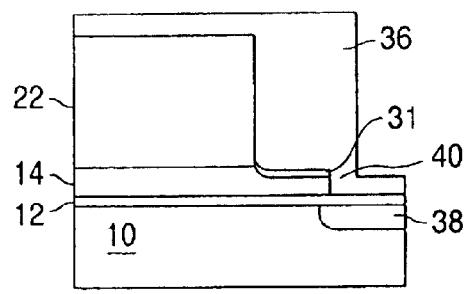

With the structure shown in FIG. 1E made using either the self aligned method or the non self-aligned method, the structure is further processed as follows. FIGS. 2A to 2N show the cross section of the active region structure 17 from a view orthogonal to that of FIGS. 1B and 1E, as the next steps in the process of the present invention are performed. It should be appreciated that while only a single memory cell in one of the active regions 17 is shown, the processing steps illustrated below form an array of such memory cells in a plurality of active regions.

A thick insulation layer 22 (e.g. nitride) is first formed on the structure, followed by a poly layer 24 formed on the nitride layer 22, as shown in FIG. 2A. The poly layer 24 is then patterned and selectively removed by using a masking operation. The masking operation includes the application of a layer of photo-resist 26 onto poly layer 24, where a photolithography mask is imaged onto the photo-resist 26. Only those imaged portions of the photo-resist are then removed, leaving portions of the poly layer 24 exposed. An anisotropic poly etch is then used to remove the exposed portions of poly layer 24, leaving portions of nitride layer 22 exposed, as illustrated in FIG. 2B.

An anisotropic nitride etch is next used to remove the exposed portions of nitride layer 22, exposing portions of poly layer 14. After the remaining portions of photo-resist 26 are removed, a controlled (sloped) poly etch is performed to create sloped portions 28 on poly layer 14 against nitride layer 22, and sloped portions 30 at the top edges of poly layer 24, as shown in FIG. 2C.

A thermal oxidation process is next used to oxidize the exposed portions of poly layers 14 and 24, forming oxide layers 31 and 32 on poly layers 14 and 24, respectively. An oxide deposition step is next, where a layer of oxide 34 is deposited (e.g. by TEOS deposition) over the structure, as shown in FIG. 2D. An oxide planarization etch follows, such as an oxide chemical-mechanical polishing (CMP) etch process, that removes the upper portions of oxide layers 32/34 (using poly layer 24 as an etch stop or using a time controlled polish until poly layer 24 is exposed), and leaving oxide layer 34 with substantially planar upper surfaces 34a. A poly etch follows to remove poly layer 24. The resulting structure is shown in FIG. 2E.

A controlled oxide etch is next performed to remove oxide layers 32/34, except for oxide blocks 36 disposed laterally adjacent to nitride layer 22. This oxide etch maintains the substantially planar upper surfaces 36a of oxide blocks 36, and leaves portions of poly layer 14 exposed, as shown in FIG. 2F. A poly etch is then used to remove the exposed portions of poly layer 14, leaving portions of oxide layer 12 exposed. Suitable ion implantation (and possible anneal) is then made across the entire surface of the structure. Where the ions have sufficient energy to penetrate the oxide layer 12, they then form first (source) regions 38 in the substrate 10. In all other regions, the ions are absorbed by the existing structure, where they have no effect. Oxide is then formed (e.g. deposited and/or grown) over the structure, which thickens oxide block 36, forms additional oxide over nitride layer 22 and oxide layer 12, and forms oxide 40 laterally adjacent to the exposed end portions of poly layer 14, as shown in FIG. 2G.

Figure 2H:
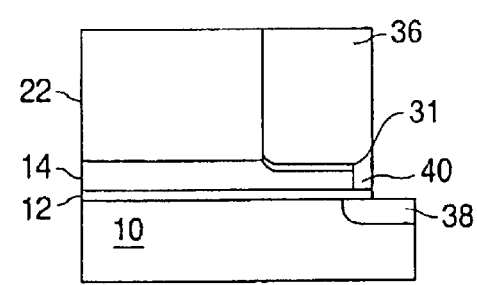
Figure 2I:
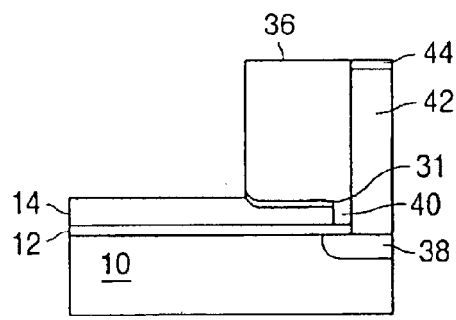

An anisotropic oxide etch is next used to remove the thin oxide layers over nitride layer 22 and the substrate (above source 38), as shown in FIG. 2H. A thick poly layer is deposited over the structure, followed by a poly CMP etch (using nitride layer 22 and/or oxide block 36 as the etch stop) that removes the deposited polysilicon except for poly blocks 42 disposed over source regions 38 laterally adjacent to oxide blocks 36. A thermal oxidation step is performed to form a thin layer of oxide 44 on poly blocks 42. A nitride etch follows, which removes nitride layer 22, leaving portions of poly layer 14 exposed. The resulting structure is shown in FIG. 2I.

Figure 2J:
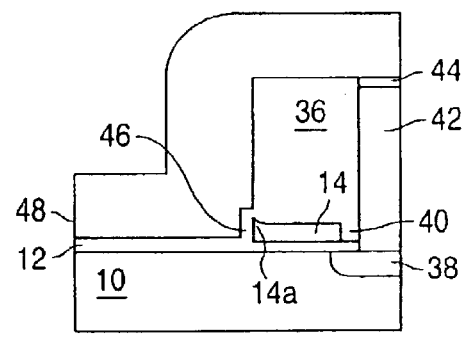

An anisotropic poly etch is performed next, which removes the exposed portions of poly layer 14, exposing portions of oxide layer 12, and leaving poly layer 14 with sharpened edges 14a. An oxide formation step follows (e.g. HTO oxide deposition), which thickens oxide layer 44, oxide block 36 and exposed portions of oxide layer 12, as well as forms an oxide layer 46 along the exposed ends of poly layer 14. A thick poly layer is then formed over the structure, as shown in FIG. 2J.

Figure 2K:
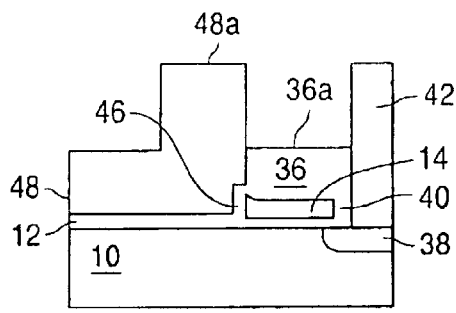
Figure 2L:
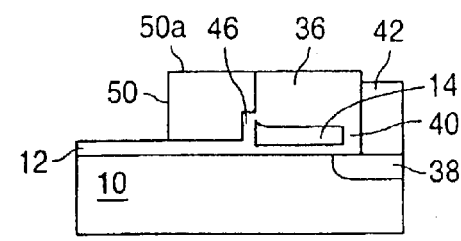

A poly CMP etch used to etch down the upper portion of poly layer 48 (using oxide block 36 as an etch stop), leaving poly layer 48 with substantially planar upper surfaces 48a. A controlled (TEOS) oxide etch follows, which removes oxide layer 44 over poly blocks 42, and removes the upper portion of oxide block 36 (so its substantially planar upper surface 36a is well below that of poly block 42), as illustrated in FIG. 2K. A poly etch is performed next, which removes poly layer 48 except for portions thereof adjacent to oxide blocks 36, resulting in blocks 50 of the polysilicon disposed adjacent to and insulated from poly layer 14. This poly etch maintains the substantially planar upper surface 50a of the poly blocks 50, and also removes the top portions of poly blocks 42. The resulting structure is shown in FIG. 2L.

Figure 2M:
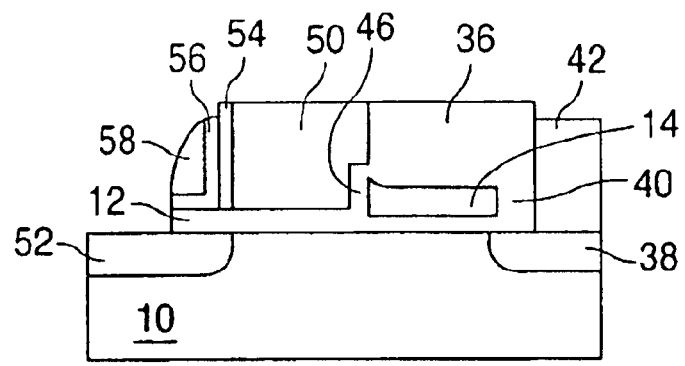
Figure 2N:
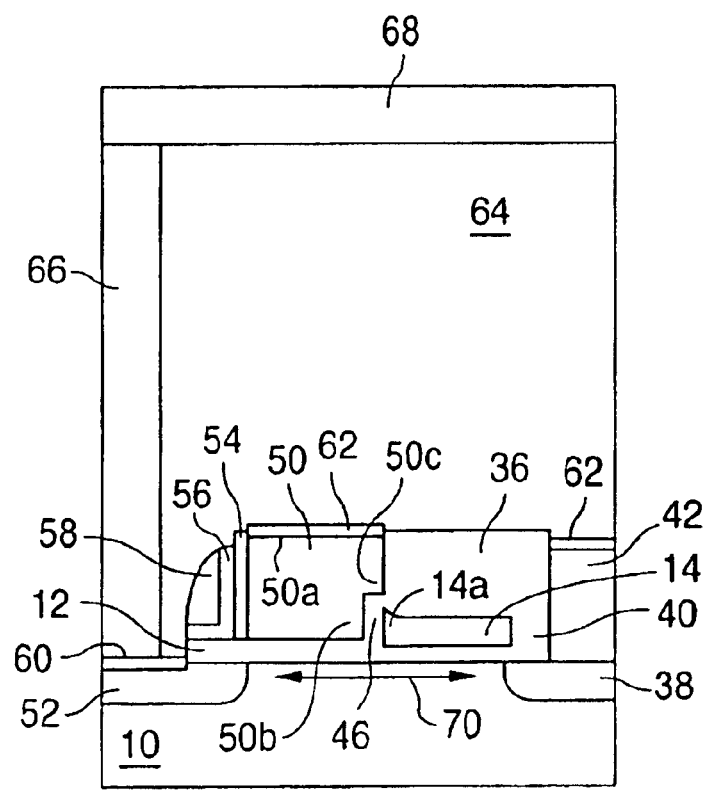

Ion implantation (e.g. N+) is next used to form second (drain) regions 52 in the substrate in the same manner as the formation of source (first) regions 38. An oxide layer 54 is then formed over the structure, followed by the formation of a nitride layer 56. Oxide spacers 58 are then formed over portions of drain regions 52 by an oxide deposition and anisotropic etch back process. A nitride etch is then used to remove the unexposed portions of nitride layer 56. A controlled oxide etch is then used to remove the exposed portions of oxide layers 12 and 54, exposing portions of substrate 10. The resulting structure is shown in FIG. 2M.

Metalized silicon (silicide) 60 and metalized polysilicon (polycide) 64 are formed over exposed substrate 10 and poly blocks 42/50, respectively, by depositing a metal such as tungsten, cobalt, titanium, nickel, platinum, or molybdenum over the structure. The structure is then annealed, permitting the hot metal to flow and to seep into the exposed top portions of the substrate 10 to form silicide 60, and into the exposed top portions of poly blocks 42 and 50 to form polycide 62. The metal deposited on the remaining structure is removed by a metal etch process. Passivation, such as BPSG 64, is used to cover the entire structure. A masking step is performed to define etching areas over the drain regions 52. The BPSG 64 is selectively etched in the masked regions to create contact openings that are ideally centered over and extend down to silicide regions 60. The contact openings are then filled with a conductor metal by metal deposition and planarization etch-back to form metal contacts 66. The silicide layers 60 facilitate conduction between the contacts 66 and drain regions 52. A bit line 68 is added by metal masking over the BPSG 64, to connect together all the contacts 66 in the column of memory cells. The final memory cell structure is illustrated in FIG. 2N.

The process of the present invention forms pairs of memory cells that mirror each other, with FIG. 2N illustrating one of the resulting memory cells. For each memory cell, the first and second regions 38/52 form the source and drain (those skilled in the art know that source and drain can be switched during operation). A channel region 70 is defined as the portion of the substrate that is in-between the source and drain 38/52. Poly block 50 constitutes the control gate, and poly layer 14 constitutes the floating gate. The control gate 50 includes a substantially planar upper surface 50a, a lower first portion 50b that is disposed laterally adjacent the floating gate 14 (insulated therefrom by oxide 46), and an upper second portion 50c that protrudes over the sharpened edge 14a of floating gate 14. Floating gate 14, which is disposed over part of the channel region 70, is partially overlapped at one end by the control gate 50, and partially overlaps the source region 38 with its other end. Each pair of memory cells shares a single source region 38. Poly blocks 42 are formed to continuously extend across the isolation and active regions 16/17 as a single source line; and thus electrically connect together all the source regions 38 in each row of paired memory cells. Likewise, control gates 50 are formed to continuously extend across the isolation/active regions 16/17 as a single word line, thus electrically connecting together all the control gates in each row of memory cells. Polycide layers 62 reduce electrical resistance across the source and word lines.

The non-volatile memory cells are of the split gate type having floating gate to control gate tunneling all as described in U.S. Pat. No. 5,572,054, whose disclosure is incorporated herein by reference with regard to the operation of such a non-volatile memory cell and an array formed thereby.

The foregoing method and memory cell array formed thereby have several advantages. First, oxide block 36 (over floating gate 14) is formed with a substantially planar upper surface 36*a* (achieved by planarization using poly layer 24 as the etch stop). This planarized upper surface facilitates the controlled etch used to reduce the height of oxide block 36 (see FIG. 2K), and provides a good reference surface for planarizing the control gate 50 and poly block 42. Second, control gate 50 is formed with a substantially planar upper surface 50*a* (achieved by planarization using the substantially planar upper surface 36*a* of oxide block 36 as an etch stop). The control gate upper planar surface 50*a* prevents the formation of stringers or other surface irregularities that can deform the final control gate structure and cause punch through problems. Further, the substantially planar upper surfaces of control gate 50 and poly block 42 facilitate the formation of polycide 62 thereon.

It is to be understood that the present invention is not limited to the embodiment(s) described above and illustrated herein, but encompasses any and all variations falling within the scope of the appended claims. For example, although the foregoing method describes the use of appropriately doped polysilicon as the conductive material used to form the memory cells, it should be clear to those having ordinary skill in the art that in the context of this disclosure and the appended claims, "polysilicon" refers to any appropriate conductive material that can be used to form the elements of non-volatile memory cells. In addition, any appropriate insulator can be used in place of silicon dioxide or silicon nitride. Moreover, any appropriate material whose etch property differs from silicon dioxide (or any insulator) and from polysilicon (or any conductor) can be used in place of silicon nitride. Further, as is apparent from the claims, not all method steps need be performed in the exact order illustrated or claimed, but rather in any order that allows the proper formation of the memory cell of the present invention. Additionally, the above described invention is shown to be formed in a substrate which is shown to be uniformly doped, but it is well known and contemplated by the present invention that memory cell elements can be formed in well regions of the substrate, which are regions that are doped to have a different conductivity type compared to other portions of the substrate. Lastly, single layers of insulating or conductive material could be formed as multiple layers of such materials, and vice versa.

What is claimed is:

1. A method of making an electrically erasable programmable memory cell, the method comprising the steps of:
   forming a first layer of polysilicon disposed over and insulated from a semiconductor substrate of a first conductivity type;
   forming a block of insulation material over the first polysilicon layer which leaves portions of the first polysilicon layer exposed;
   removing the exposed portions of the first polysilicon layer to form a floating gate underneath the block of insulation material;
   forming a block of polysilicon that is disposed over and insulated from the substrate and is disposed adjacent to and insulated from the floating gate, wherein the formation of the polysilicon block includes a planarization etch for planarizing an upper surface of the polysilicon block using an upper surface of the insulation material block as a planarization etch stop; and
   forming spaced apart first and second regions in the substrate that have a second conductivity type, with a channel region defined in the substrate between the first and second regions.

2. The method of claim 1, wherein the formation of the insulation material block includes the steps of:
   forming a layer of first material over the first polysilicon layer;
   forming a layer of second material over the first material layer;
   patterning and selectively removing portions of the second material layer and the first material layer to expose a portion of the first polysilicon layer;
   forming a layer of the insulation material over the first polysilicon layer exposed portion, wherein the insulation material layer includes portions that extend up and over the second material layer;
   performing a planarization etch that removes the portion of the insulation material layer extending over the second material layer and that substantially planarizes an upper surface of the upwardly extending portion of the insulation material layer using an upper surface of the second material layer as an etch stop; and
   performing an etch process that removes a portion of the insulation material layer over the first polysilicon layer and that reduces a height of the planarized upwardly extending portion which constitutes the insulation material block.

3. The method of claim 2, wherein the formation of the polysilicon block further includes the steps of:
   forming a second layer of polysilicon over and insulated from the substrate, wherein the second polysilicon layer includes portions that extend up and over the insulation material block;
   performing a planarization etch that removes the portion of the second polysilicon layer extending over the insulation material block and that substantially planarizes an upper surface of the upwardly extending portion of the second polysilicon layer using the upper surface of the insulation material block as an etch stop; and
   performing an etch process that removes a portion of the second polysilicon layer and that reduces a height of the planarized second polysilicon layer upwardly extending portion which constitutes the polysilicon block.

4. The method of claim 1, further comprising the step of:
   forming a block of conductive material over the first region, wherein the formation of the conductive material block includes a planarization etch for planarizing an upper surface of the conductive material block using the upper surface of the insulation material block as a planarization etch stop.

5. The method of claim 4, further comprising the step of:
   performing an etch process to reduce a height of the upper surface of the insulation material block after the formation of the conductive material block.

6. The method of claim 1, further comprising the step of:
forming a layer of insulation material between the insulation material block and the floating gate.

7. The method of claim 1, further comprising the step of:
forming metalized polysilicon on the upper surface of the polysilicon blocks.

8. The method of claim 1, wherein the formation of the polysilicon block includes forming a first portion thereof disposed laterally adjacent to and insulated from the floating gate and forming a second portion thereof disposed over and insulated from the floating gate.

9. A method of making an array of electrically erasable programmable memory cells, the method comprising the steps of:
forming a first layer of polysilicon disposed over and insulated from a semiconductor substrate of a first conductivity type;
forming blocks of insulation material over the first polysilicon layer;
removing portions of the first polysilicon layer not disposed underneath the blocks of insulation material to form a plurality of spaced apart floating gates;
forming blocks of polysilicon each disposed over and insulated from the substrate and each disposed adjacent to and insulated from one of the floating gates, wherein the formation of the polysilicon blocks includes a planarization etch for planarizing upper surfaces of the polysilicon blocks using upper surfaces of the insulation material blocks as a planarization etch stop; and
forming spaced apart first and second regions in the substrate that have a second conductivity type, with channel regions each defined in the substrate between one of the first regions and one of the second regions.

10. The method of claim 9, wherein the formation of the insulation material blocks includes the steps of:
forming a layer of first material over the first polysilicon layer;
forming a layer of second material over the first material layer;
patterning and selectively removing portions of the second material layer and the first material layer to expose portions of the first polysilicon layer;
forming a layer of the insulation material over the first polysilicon layer exposed portions, wherein the insulation material layer includes portions that extend up and over the second material layer;
performing a planarization etch that removes the portions of the insulation material layer extending over the second material layer and that substantially planarizes upper surfaces of the upwardly extending portions of the insulation material layer using an upper surface of the second material layer as an etch stop; and
performing an etch process that removes portions of the insulation material layer and that reduces a height of the planarized upwardly extending portions which constitute the insulation material blocks.

11. The method of claim 10, wherein the formation of the polysilicon blocks further includes the steps of:
forming a second layer of polysilicon over and insulated from the substrate, wherein the second polysilicon layer includes portions that extend up and over the insulation material blocks;
performing a planarization etch that removes the portions of the second polysilicon layer extending over the insulation material blocks and that substantially planarizes upper surfaces of the upwardly extending portions of the second polysilicon layer using the upper surfaces of the insulation material blocks as an etch stop; and
performing an etch process that removes portions of the second polysilicon layer and that reduces a height of the planarized second polysilicon layer upwardly extending portions which constitute the polysilicon blocks.

12. The method of claim 9, further comprising the step of:
forming blocks of conductive material over the first regions, wherein the formation of the conductive material blocks includes a planarization etch for planarizing upper surfaces of the conductive material blocks using the upper surfaces of the insulation material blocks as a planarization etch stop.

13. The method of claim 12, further comprising the step of:
performing an etch process to reduce a height of the upper surface of the insulation material blocks after the formation of the conductive material blocks.

14. The method of claim 9, further comprising the step of:
forming a layer of insulation material between each of the insulation material blocks and one of the floating gates.

15. The method of claim 9, further comprising the step of:
forming metalized polysilicon on the upper surfaces of the blocks of polysilicon.

16. The method of claim 9, wherein the formation of each of the polysilicon blocks includes forming a first portion thereof disposed laterally adjacent to and insulated from one of the floating gates and forming a second portion thereof disposed over and insulated from the one floating gate.

17. The method of claim 9, further comprising the step of:
forming spaced apart isolation regions on a semiconductor substrate that are substantially parallel to one another and extend in a first direction, with an active region between each pair of adjacent isolation regions, wherein the polysilicon blocks and insulation material blocks are formed in the active regions, and wherein the formation of the polysilicon blocks further includes forming a plurality of conductive control lines each extending across the active and isolation regions in the second direction substantially perpendicular to the first direction and each electrically connecting together one of the polysilicon blocks from each of the active regions.

* * * * *